(12) United States Patent
Stiff

(10) Patent No.: US 6,466,078 B1
(45) Date of Patent: Oct. 15, 2002

(54) REDUCED STATIC PHASE ERROR CMOS PLL CHARGE PUMP

(75) Inventor: Jonathon C. Stiff, Mountlake Terrace, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/849,164

(22) Filed: May 4, 2001

(51) Int. Cl.[7] .................................................. G05F 1/10
(52) U.S. Cl. ........................................ 327/536; 327/157
(58) Field of Search .............................. 327/157, 148, 327/536; 331/17

(56) References Cited

U.S. PATENT DOCUMENTS

| | | | | |
|---|---|---|---|---|
| 5,363,066 A | * | 11/1994 | Chen et al. | 327/108 |
| 5,576,647 A | * | 11/1996 | Sutardja et al. | 327/108 |
| 6,204,705 B1 | * | 3/2001 | Lin | 327/158 |
| 6,229,345 B1 | * | 5/2001 | Kirkland et al. | 327/65 |
| 6,320,435 B1 | * | 11/2001 | Tanimoto | 327/156 |

* cited by examiner

*Primary Examiner*—Kenneth B. Wells
*Assistant Examiner*—Cassandra Cox
(74) *Attorney, Agent, or Firm*—Christopher P. Maiorana, P.C.

(57) ABSTRACT

An apparatus comprising a pump up circuit, a pump down circuit and an output circuit. The pump up circuit may be configured to generate a pump up signal and receive a first source bias. The pump down circuit may be configured to generate a pump down signal and receive a second source bias. The output circuit may be configured to receive the pump up and pump down signals and generate an output signal. The pump up circuit may be configured to precharge the first source bias and the pump down circuit may be configured to precharge the second source bias signal.

17 Claims, 4 Drawing Sheets

US 6,466,078 B1

REDUCED STATIC PHASE ERROR CMOS PLL CHARGE PUMP

FIELD OF THE INVENTION

The present invention relates to a method and/or architecture for implementing phase lock loop (PLL) charge pumps generally and, more particularly, to a method and/or architecture for implementing reduced static phase error CMOS PLL charge pumps.

BACKGROUND OF THE INVENTION

FIG. 1 shows a circuit 10 implementing a conventional PLL. The circuit 10 includes a circuit 12, a circuit 14, a circuit 16, a circuit 18 and a circuit 20. The circuit 12 is implemented as a phase frequency detector (PFD), the circuit 14 is implemented as a voltage controlled oscillator (VCO), the circuit 16 is implemented as a passive loop filter, the circuit 18 is implemented as a current source and the circuit 20 is implemented as a current source. The PFD 12 receives a reference signal REF and a feedback signal FB from the VCO 14. The PFD 12 generates a pump up signal (UP) or a pump down signal (DN). The circuits 18 and 20 respond to the pump up signal UP and the pump down signal DN to generate currents IUP and IDN. The currents IUP and IDN present charge to the passive loop filter to generate a control voltage VCTRL.

The PLL 10 attempts to match the phase and frequency of the feedback signal FB and the reference signal REF with a negative feedback loop. The PFD 12 senses the phase/frequency error between the signal REF and the signal FB, generating the signals UP and DN with pulse widths proportional to the error.

The PLL charge pump 10 asserts fixed source current (IUP) and sink current (IDN) on the loop filter for the duration of the UP (i.e., TUP) and DN (i.e., TDN) pulse widths, respectively. The application of current on the loop filter 16 modulates the control voltage VCTRL of the PLL voltage controlled oscillator 14. The change in the control voltage VCTRL raises/lowers the frequency and phase of the output OUT of the VCO 14, which is then fed back to the PFD 12 as the signal FB. Therefore, the PLL 10 operates as a control loop that attempts to match the phase and frequency of the VCO 14 to that of an external reference signal REF.

As the PLL 10 achieves phase lock (i.e., the signal OUT=REF), the pulse widths of the signals UP and DN become equal indicating no phase error between the signals OUT and REF. With the pulses UP and DN equal, current sourced to the loop filter 16 is equal to the current sunk, resulting in zero net charge being delivered. The zero net charge freezes the control voltage VCTRL, on the loop filter 16 and holds the phase and frequency of the output OUT of the VCO 14. Ideally, when the PLL 10 is in lock, the signals REF and OUT match in both phase and frequency. However, if the phase error between the signal REF and the signal FB were sensed incorrectly, the PLL 10 would lock the signal OUT to the signal REF with the same error.

Since the PFD 12 is responsible for sensing the phase error in the PLL 10, an error in the PFD 12 would lead to phase error in the PLL 10. However, the magnitude of the phase error detected by the PFD 12 must also be translated into a proportional net charge delivered to the loop filter 16 by the charge pump (i.e., the circuits 18 and 20). As previously stated, the net charge delivered by the charge pump is dependent on the fixed source/sink currents and the durations of the pulses UP and DN (QNET=IUP*TUP−IDN*TDN). If there is either a mismatch in the fixed currents or a skew in the duration of the pulses UP/DN, a non-zero net charge will result on the loop filter 16. Therefore, even if the PFD 12 is working perfectly, the charge pump can affect a static phase error at the output OUT of the PLL 10.

Referring to FIG. 2, a charge pump 30 is shown. The charge pump 30 comprises an inverter 32, an inverter 34, a transistor MP1, a transistor MP2, a transistor MN2 and a transistor MN1. A gate of the transistor MP1 receives a PMOS source bias signal. A gate of the transistor MP2 receives a PMOS cascode bias signal. A gate of the transistor MN1 receives a NMOS cascode bias signal. A gate of the transistor MN2 receives a NMOS source bias signal.

The circuit 30 is a relatively simple circuit that implements the PLL charge pump with a cascoded PMOS current source and a cascoded NMOS current sink. The current source and sink are cascoded to increase the output impedance in order to maintain the currents IUP and IDN as constant as possible over the output voltage range. The bias voltages for the current source and sink are generated by a set of matched current mirrors, typically from a stable current reference. The signal UPM, the complement of UP, and the signal DN drive inverters that act as low impedance switches to the supply VDD and ground VSS, allowing the source and sink currents to be turned "on" and "off." For example, when the signal UPM is at low voltage (i.e., UPM=L), the signal UP is driven to nearly the supply VDD, turning on the transistor MP1 and allowing the current source to conduct current. When the signal UPM is at high voltage (i.e., UPM=H), the signal UP is driven to ground VSS, switching off the transistor MP1 and halting the flow of current.

The primary disadvantage of the conventional approaches is that some of the non-ideal properties of the circuit can lead to an imbalance in the charge delivered by the current source and sink over a given interval ($_T\int IUP(t)dt \neq _T\int IDN(t)dt$), leading to an effective static phase error in the PLL. Two mechanisms of the current imbalance arise from modulation of the gate to source voltage (VSG or VGS) of transistors MP1 and MN1 while switching the charge pump. These mechanisms are:

Switching voltage on UP (or DNM) couples across the CGS of MP1 (or MN1) onto the transistor PMOS (or NMOS) source bias, causing a voltage modulation of CGS/(CGS+CBIAS) times the switching voltage on UP (or DNM), VSWITCH-STEP. The modulation of VSG causes a short-term mismatch between charge pump source/sink current and the base reference current used to generate the bias voltages. Since the recovery time of the bias voltages is typically considerably longer than the switching frequency of the charge pump, the source/sink current mismatch can be considerable.

The charge pump switching inverters 32 and 34 also place small glitch voltages (i.e., transient spikes), on the order of 50–100 mV, on the signals UP and DNM when switching the source or sink current "on" or "off". The glitch is typical for CMOS inverters and is caused by the input rise/fall edge that couples to the output before the inverter MOSFETs can pull the output to VDD or VSS. Because the inverter output is at VDD or VSS when the switching occurs, the glitch pushes the output voltage 50–100 mV above or below VDD or VSS, respectively. The glitch has little effect when the current source (or sink) is being turned "on" because there is no current being conducted.

When the source (or sink) is being turned off, the glitch can have a dramatic effect on output current. The current mirror that biases the transistor MP1 (or MN1) generates a gate voltage based on the supply VDD (or ground VSS) reference at the source of a diode connected MOSFET. Ideally, when the current source (or sink) of the charge pump is turned on, the switching inverters place the supply VDD on the source of the transistors MP1 (or places ground VSS on the source of the transistor MN1) to replicate the bias conditions of the current mirror in order to generate an identical current. When the current source (or sink) is turned off, the source voltage is simply pulled to ground VSS (or the supply VDD for the transistor MN1). Before this occurs, however, the source voltage of the transistor MP1 (or MN1) receives the glitch from the switching inverter 32 or 34, causing a temporary mismatch between the source (or sink) and the bias generator. This causes a current glitch on the source (or sink) that can greatly mismatch the total charge output OUT from the charge pump 30.

Conventional PLLs have static charge error (phase error in PLL) if IUP≠IDN and QNET=IUP*TUP−IDN*TDN.

SUMMARY OF THE INVENTION

A first aspect of the present invention concerns an apparatus comprising a pump up circuit, a pump down circuit and an output circuit. The pump up circuit may be configured to generate a pump up signal and receive a first source bias. The pump down circuit may be configured to generate a pump down signal and receive a second source bias. The output circuit may be configured to receive the pump up and pump down signals and generate an output signal. The pump up circuit may be configured to precharge the first source bias and the pump down circuit may be configured to precharge the second source bias signal.

A second aspect of the present invention concerns an apparatus comprising a pump up circuit, a pump down circuit and an output circuit. The pump up circuit may comprise a first delay element and may be configured to generate a pump up signal. The pump down circuit may comprise a second delay element and may be configured to generate a pump down signal. The output circuit may be configured to receive the pump up and pump down signals and generate an output signal. The pump up circuit may be configured to deglitch the pump up signal and the pump down circuit may be configured to deglitch the pump down signal.

The objects, features and advantages of the present invention include implementing a charge pump that may reduce static phase error between the reference and feedback signals (at the input of a PLL phase detector) in a digital PLL. The static phase error of the PLL is a specification for zero delay buffer PLL applications.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
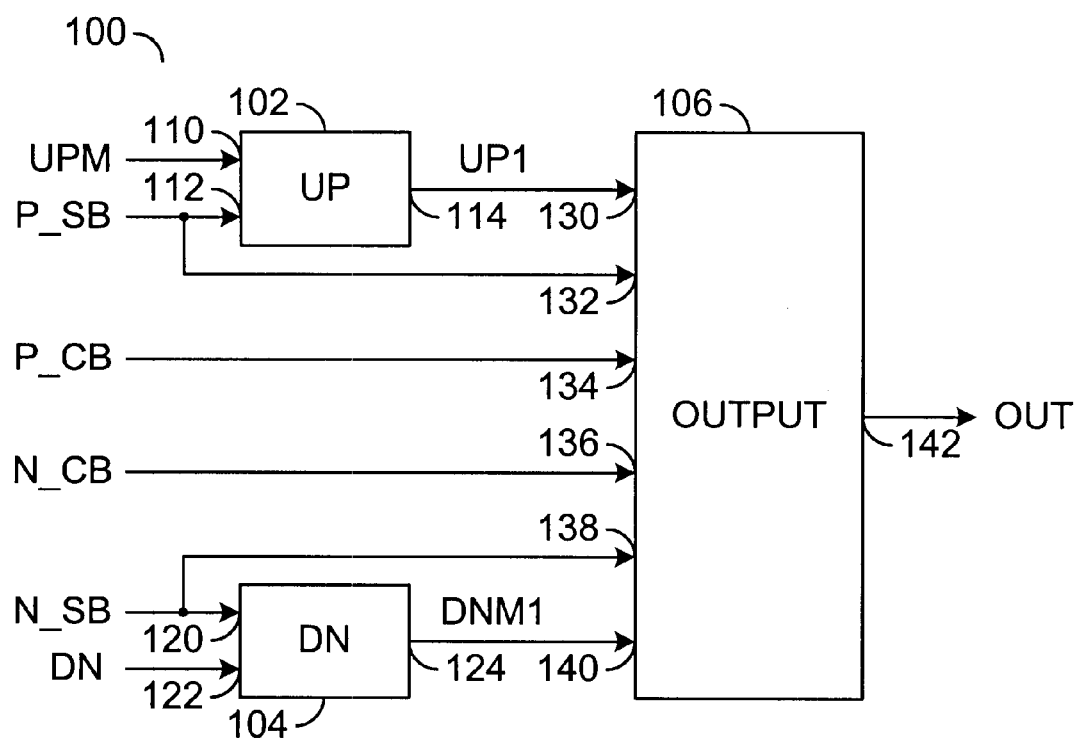
FIG. 3 is a block diagram of a preferred embodiment of the present invention.

Referring to FIG. 3, a block diagram of a circuit 100 is shown in accordance with a preferred embodiment of the present invention. The circuit 100 may be implemented as a reduced static phase error CMOS PLL charge pump. The circuit 100 may provide an improvement on a basic digital PLL charge pump design to reduce variation in output current, due to switching effects, in order to reduce the static phase error of a PLL. Low static phase error may be important in the design of zero delay buffer (ZDB) PLLs.

The circuit 100 may precharge source bias/add capacitance to compensate for switching voltage coupling. The circuit 100 may also deglitch switching signals using delay between switching inverter MOSFETs. The circuit 100 effectively reduces variations in charge pump output current. The circuit 100 may decrease the static phase error of a PLL.

The circuit 100 generally comprises a circuit 102, a circuit 104 and a circuit 106. The circuit 102 may be implemented as a pump up circuit. The circuit 104 may be implemented as a pump down circuit. The circuit 106 may be implemented as an output circuit. The circuit 102 generally has an input 110 that may receive a signal (e.g., UPM), an input 112 that may receive a signal (e.g., a PMOS source bias signal P_SB), and an output 114 that may present a signal (e.g., UP1). The circuit 104 may have an input 120 that may receive a signal (e.g., a NMOS source bias signal N_SB), an input 122 that may receive a signal (e.g., DN) and an output 124 that may present a signal (e.g., DNM1). The circuit 106 may have an input 130 that may receive the signal UP1, an input 132 that may receive the signal P_SB, an input 134 that may receive a signal (e.g., a PMOS cascode bias signal P_CB), an input 136 that may receive a signal (e.g., a NMOS cascode bias signal N_CB), an input 138 that may receive the signal N_SB, an input 140 that may receive the signal DNM1. The circuit 106 may also have an output 142 that may present a signal (e.g., OUT).

Figure 4:
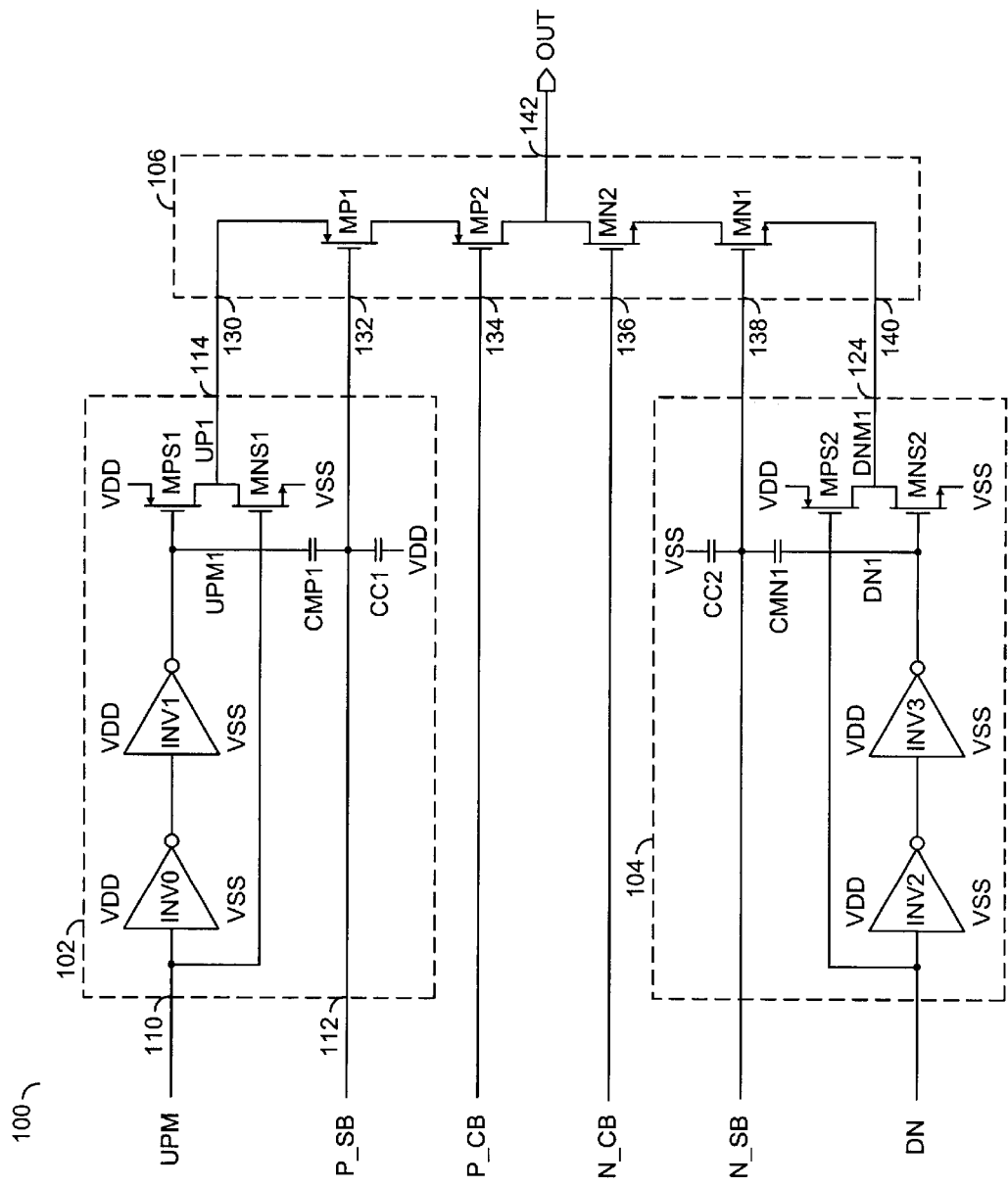
FIG. 4 is a more detailed diagram of a preferred embodiment of the present invention.

Referring to FIG. 4, a more detailed diagram of the circuit 100 is shown. The circuit 102 generally comprises an inverter INV0 an inverter INV1, a transistor MPS1, a transistor MNS1, a capacitor CMP1, and a capacitor CC1. The inverter INV0 generally receives the signal UPM. The inverter INV1 is generally connected between the inverter INV0 and a gate of the transistor MPS1. The transistor MNS1 may have a gate that receives the signal UPM. The capacitors CMP1 and CC1 are generally connected between the gate of the transistor MPS1 and ground.

The circuit 104 generally comprises an inverter INV2, an inverter INV3, a capacitor CC2, a capacitor CMN1, a transistor MPS2 and a transistor MNS2. The inverter INV2 and a gate of the transistor MPS2 receive the signal DN. The inverter INV3 is generally connected between the inverter INV2 and a gate of the transistor MNS2. The capacitors CC2 and CMN1 are connected between a gate of the transistor MNS2 and a supply voltage VSS.

The output circuit 106 generally comprises a transistor MP1, a transistor MP2, a transistor MN1 and a transistor MN2. The transistors MP1 and MP2 may be implemented as PMOS transistors. The transistors MN1 and MN2 may be implemented as NMOS transistors. However, the various transistor types may be varied accordingly to meet the design criteria of a particular implementation.

The circuit 100 may deliver a controlled charge to the passive loop filter of a digital phase locked loop (PLL). The charge pump 100 may incorporate several features that reduce contribution to the static phase error of a PLL. The circuit 100 uses techniques to remove or reduce the effects of the mechanisms of voltage coupling on current source/sink biases and turn-off glitching.

The capacitors CC1 (or CC2) may be implemented as large decoupling capacitors and are generally connected to the bias nodes P_SB (or N_SB). Such a configuration may lower the bias voltage step to VSWITCH−STEP*CGS/(CGS+CBIAS+CC). To further reduce the step, a capacitor CM (e.g., CMP1 or CMN1), may be added between the switching stage directly preceding the source node UPM1 (or DN1) and the bias node. The capacitor CM may add an additional charge injection on the bias node, but one that is generally opposite to the injection from CGS.

In general, if CM=CGS, no net charge is injected on the bias node and the bias voltage generally is not changed. The switching voltages on CM and CGS (from the signals UPM1 and UP1 or DN1 and DNM1) may not occur simultaneously and are separated by a switching delay. Therefore, during each switching event (of the signal UPM1 or DN), the bias node steps in voltage for a single switching delay (of the transistor MP1 or MN1) and then steps back to its previous voltage (as UP1 or DNM1 is switched). In general, only one of the discontinuities effects the charge pump current since the discontinuity as the source/sink is switched "on" occurs before current conduction. Only the discontinuity when switching the current source/sink "off" can affect the output current, although only for a single switching delay. With the addition of the bias node decoupling capacitors, the step may remain small.

The transistors UP1 and DNM1 may be deglitched at turn "off" by inserting delay between the pull-up transistors (MPS1 and MPS2) and pull-down transistors (MNS1 and MNS2) driving the nodes. The added delay may cause the transistor MNS1 (or MPS2) to switch "on" before the transistor MPS1 (or MNS2) can switch "off." In doing so, the glitch charge from the transistor MNS1 (or MPS2) turn "on" is absorbed by the transistor MPS1 (or MNS2). The corresponding voltage decrease on the signal UP1 (or increase on the signal DNM1) is sufficient to switch "off" the charge pump current source (or sink) without glitching on the signal UP1 (or the signal DNM1). The transistor MPS1 (or MNS2) may switch "off" after a fixed delay (e.g., the inverters INV0 and INV1 or INV2 and INV3) with its glitch charge absorbed by the transistor MNS1 (or MPS2). While the second deglitching operation may not be explicitly necessary in every design implementation, since the current source/sink is already off, the second deglitching may ensure that a glitch does not temporarily turn "on" the current source/sink while the signals UP1 or DNM1 are in an intermediate voltage state (between supply VDD and ground VSS). The signal UP1 is eventually pulled to ground VSS and the signal DN1 is pulled to the supply VDD. The circuit 100 may remove glitches on the signals UP1 and DNM1 as the charge pump current source/sink turns off. The circuit 100 may also amplify the voltage glitches at turn on. Fortunately, the glitches occur when the current source and sink are off and generally have little impact on the output current OUT.

Figure 5:
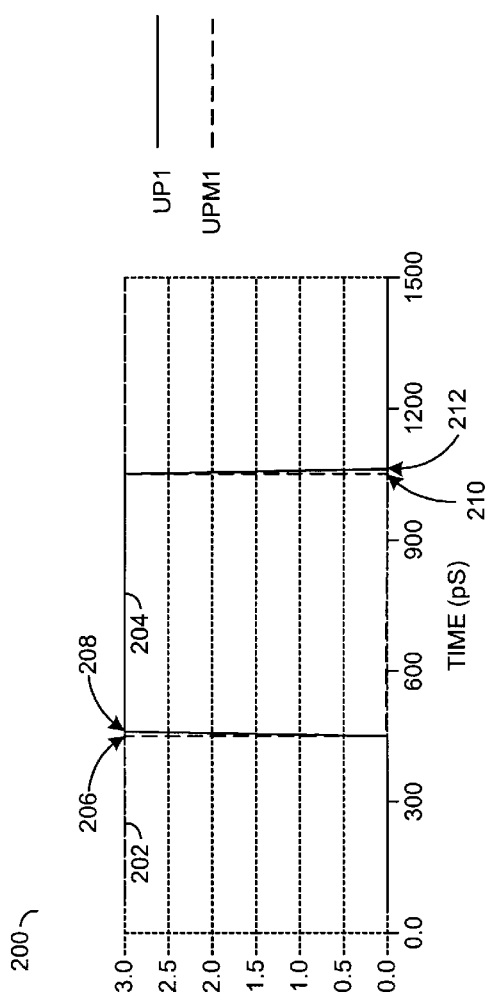
FIG. 5 is a timing diagram illustrating an operation of the conventional charge pump circuit.

Referring to FIG. 5, a timing diagram 200 illustrating an operation of the signals UP1 and UPM1 is shown. The waveform 202 generally shows the voltage of the signal UP1 over time. The waveform 204 generally shows the voltage of the signal UPM1 over time. The signal UPM1 may begin to switch from high to low at a time 206. The signal UP1 may switch from low to high at a time 208. The signal UPM1 may begin to switch from low to high at a time 210. The signal UP1 may switch from high to low at a time 212.

Figure 1:
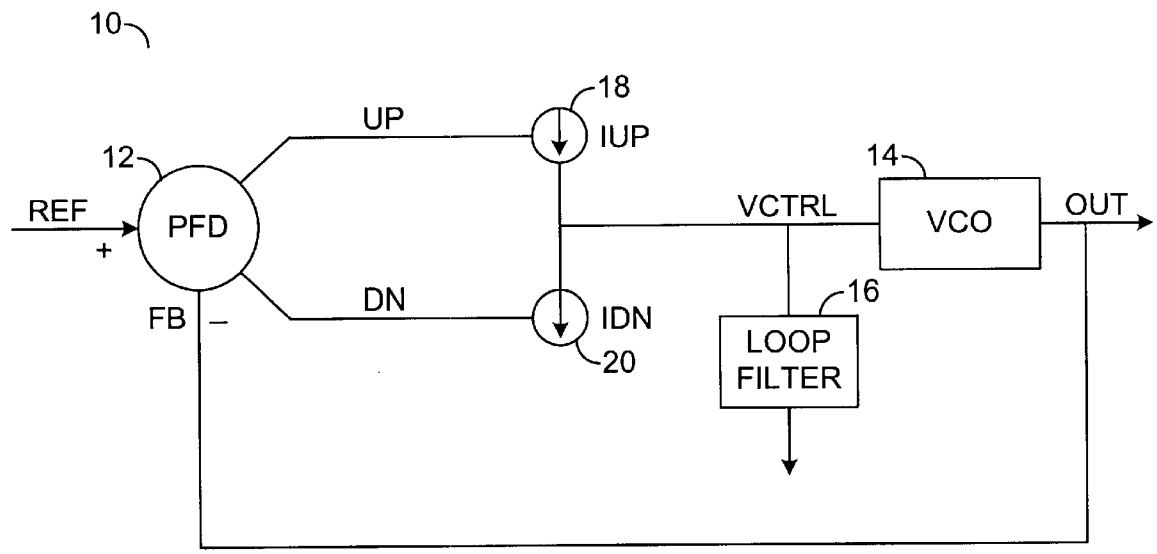
FIG. 1 is a block diagram of a conventional PLL circuit.
Figure 2:
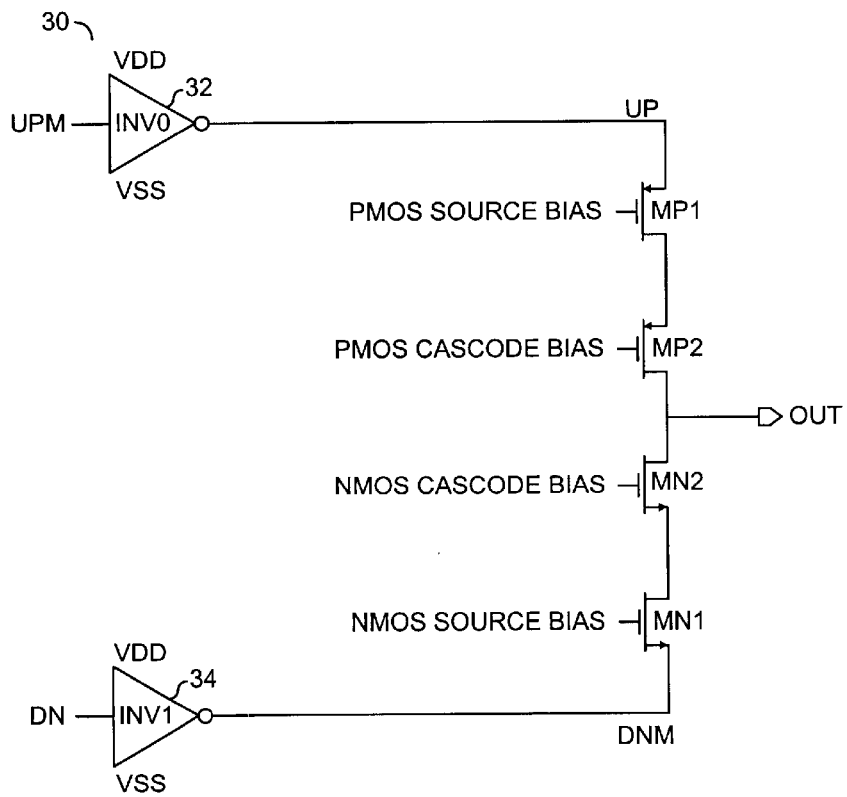
FIG. 2 is a circuit diagram of a conventional PLL charge pump circuit.
Figure 6:
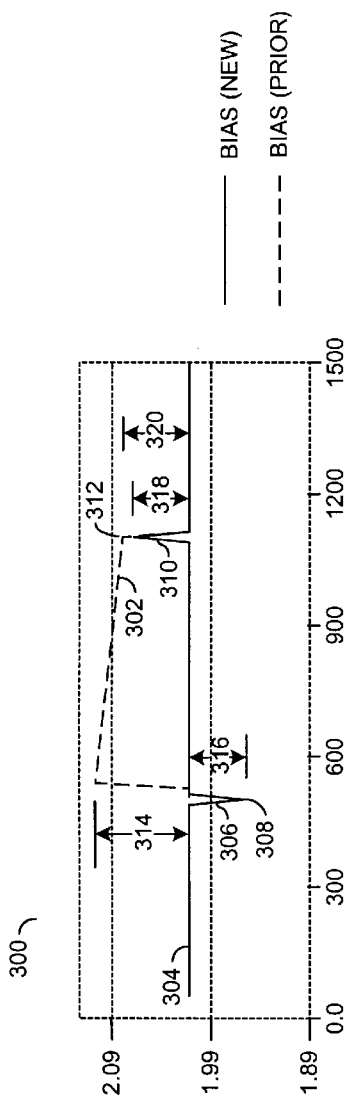
FIG. 6 is a timing diagram illustrating an operation of the present invention.

Referring to FIG. 6, a timing diagram 300 illustrating an operation of the prior and new bias is shown. The waveform 302 generally shows the voltage of a service bias signal (e.g., BIAS(PRIOR)) of a conventional PLL charge pump circuit (e.g., the PLL charge pump 30 of FIG. 2). The waveform 304 generally shows the voltage of a source bias signal (e.g., BIAS(NEW)) of the circuit 100. In one example, the signal BIAS(NEW) may correspond to the signal P_SB. In the diagram 300, the times 306, 308, 310 and 312 may correspond approximately to the times 206, 208, 210, and 212, respectively of FIG. 5.

During the time period from the time 306 to the time 308 the signal BIAS(NEW) may glitch to a level 316. During the time period from the time 308 to the time 312 the signal BIAS (PRIOR) may glitch from a level 314 to a level 318. During the time period from the time 310 to the time 312 the signal BIAS(NEW) may glitch to a level 318. The glitch levels 316 and 318 of the signal BIAS(NEW) may be of a lower magnitude than the glitch levels 314 and 318 of the signal BIAS (PRIOR). The duration of the glitches of the signal BIAS (NEW) may be significantly shorter than the duration of the glitch of the signal BIAS (PRIOR). The circuit 100 may generate similar reductions of glitch magnitude and duration on other PLL bias signals.

The present invention may require additional silicon area due to an increased number of devices and area consumed by the decoupling capacitors (CC1, CC2, CMP1 and CMN1). The additional inverters (INV1 and INV3) may slightly increase the signal delay through the block. However, the delay generally has no appreciable effect. The deglitching circuit 100 may also consume more current than a standard inverter when switching "off". The circuit 100 may not affect PLL performance except, possibly, for low power applications.

Alternatively, the decoupling capacitors on the bias nodes of the charge pump and the precharge compensation capacitors may be implemented with any of the standard CMOS techniques for building on-chip capacitors. Such capacitor types may include MOSFET or semiconductor junction based capacitors, and parallel plate capacitors formed by the polysilicon or metal layers. In addition, the delay elements formed by inverters INV0, INV1, INV2 and INV3 may be replaced with any generic short delay CMOS logic device.

The circuit 100 may provide reduced static phase error between input reference and feedback signals in a digital PLL. The static phase error of the PLL is a critical specification for zero delay buffer PLL applications. The circuit 100 may (i) de-glitch the charge pump switching mechanism and (ii) precharge compensation of the charge pump current source/sink biases. Both techniques may reduce the variation in charge pump output current and, therefore, the phase error contribution of the charge pump within a digital PLL.

The circuit 100 may provide an improvement of an existing design to provide a reduction in phase error in a digital PLL. The circuit 100 may simply replace instances of previous designs with no modification to the rest of the loop. The circuit 100 may be implemented as the charge pump of a digital PLL with a phase detector producing UP and DN phase error outputs. However, the circuit 100 may be preferably implemented in PLLs where static phase error between reference and feedback signals is a critical specification.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a pump up circuit configured to generate a pump up signal in response to a first source bias, said pump up circuit comprises a first capacitance coupled to said first source bias configured to compensate for a positive switching voltage;
    a pump down circuit configured to generate a pump down signal in response to a second source bias, said pump down circuit comprises a second capacitance coupled to said second source bias configured to compensate for a negative switching voltage; and
    an output circuit configured to generate an output signal in response to said pump up and pump down signals, wherein said pump up circuit is configured to precharge said first source bias and said pump down circuit is configured to precharge said second source bias signal.

2. The apparatus according to claim 1, wherein:
    said first capacitance comprises a first capacitor coupled between said first source bias and said positive switching voltage; and
    said second capacitance comprises a second capacitor coupled between said second source bias and said negative switching voltage.

3. The apparatus according to claim 2, wherein:
    said first capacitance comprises a third capacitor coupled between said first source bias and a first reference voltage; and
    said second capacitance comprises a fourth capacitor coupled between said second source bias and a second reference voltage.

4. The apparatus according to claim 1, wherein said first source bias comprises a PMOS source bias and said second source bias comprises a NMOS source bias.

5. The apparatus according to claim 1, wherein said output circuit is further configured to receive a first cascode bias and a second cascode bias.

6. The apparatus according to claim 5, wherein said first cascode bias comprises a PMOS cascode bias and said second cascode bias comprises an NMOS cascode bias.

7. The apparatus according to claim 1, wherein said apparatus comprises a reduced static phase error CMOS PLL charge pump.

8. A method for reducing static phase error, comprising the steps of:
    (A) generating a pump up signal in response to a first source bias and compensating for a positive switching voltage with a first capacitance coupled to said first source bias;
    (B) generating a pump down signal in response to a second source bias and compensating for a negative switching voltage with a second capacitance coupled to said second source bias;
    (C) generating an output signal in response to said pump up and pump down signals; and
    (D) precharging said first source bias and said second source bias signal.

9. A method for reducing static phase error, comprising the steps of:
    (A) generating a pump up signal with a first delay element comprising a first and a second inverting buffer coupled in series;
    (B) generating a pump down signal with a second delay element comprising a third and a fourth inverting buffer coupled in series;
    (C) generating an output signal in response to said pump up and pump down signals; and
    (D) deglitching said pump up signal and said pump down signal.

10. The method according to claim 9, wherein:
    step (A) further comprises compensating for a positive switching voltage with a first capacitance coupled to a first source bias; and
    step (B) further comprises compensating for a negative switching voltage with a second capacitance coupled to a second source bias.

11. An apparatus comprising:
    a pump up circuit (a) comprising a first delay element comprising a first and a second inverting buffer coupled in series and (b) configured to generate a pump up signal;
    a pump down circuit comprising (a) a second delay element comprising a third and a fourth inverting buffer coupled in series and (b) configured to generate a pump down signal; and
    an output circuit configured to (a) receive said pump up and pump down signals and (b) generate an output signal, wherein said pump up circuit is configured to deglitch said pump up signal and said pump down circuit is configured to deglitch said pump down signal.

12. The apparatus according to claim 11, wherein:
    said pump up circuit further comprises a first capacitance coupled to a first source bias and configured to compensate for a positive switching voltage; and
    said pump down circuit further comprises a second capacitance coupled to a second source bias and configured to compensate for a negative switching voltage.

13. The apparatus according to claim 11, wherein:
    said first delay element is configured to generate said pump up signal; and
    said second delay element is configured to generate said pump down signal.

14. The apparatus according to claim 11, wherein:
    said pump up circuit comprises a first one or more MOSFETs configured to generate said pump up signal; and
    said pump up circuit comprises a second one or more MOSFETs configured to generate said pump down signal.

15. The apparatus according to claim 11, wherein:
    said pump up circuit is further configured to receive a PMOS source bias; and
    said pump down circuit is further configured to receive a NMOS source bias.

16. The apparatus according to claim 11, wherein said output circuit is further configured to receive a PMOS cascode bias and a NMOS cascode bias.

17. The apparatus according to claim 11, wherein said apparatus comprises a reduced static phase error CMOS PLL charge pump.

* * * * *